US009088841B2

(12) United States Patent
Veneri et al.

(10) Patent No.: US 9,088,841 B2
(45) Date of Patent: Jul. 21, 2015

(54) SIGNAL PROCESSOR AND METHOD FOR COMPENSATING LOUDSPEAKER AGING PHENOMENA

(75) Inventors: Marco Veneri, Milan (IT); Francesco Bianchi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 660 days.

(21) Appl. No.: 13/342,798

(22) Filed: Jan. 3, 2012

(65) Prior Publication Data

US 2012/0177224 A1 Jul. 12, 2012

(30) Foreign Application Priority Data

Jan. 4, 2011 (IT) .............................. MI2011A0002

(51) Int. Cl.
*H04R 29/00* (2006.01)
*H03G 5/00* (2006.01)
*H04R 3/00* (2006.01)

(52) U.S. Cl.
CPC ...................................... *H04R 3/002* (2013.01)

(58) Field of Classification Search
CPC ............ H04R 3/002; H04R 3/02; H04R 3/08; H04R 3/007; H04R 29/003; H04R 29/001
USPC ........................ 381/96, 98, 103, 59, 116, 117
See application file for complete search history.

(56) References Cited

U.S. PATENT DOCUMENTS

| | | | | |
|---|---|---|---|---|
| 4,727,584 | A | 2/1988 | Hall | |
| 5,694,476 | A | 12/1997 | Klippel | 381/96 |
| 8,300,837 | B2 * | 10/2012 | Shmunk | 381/59 |
| 2007/0288235 | A1 * | 12/2007 | Vaananen et al. | 704/229 |
| 2012/0106750 | A1 * | 5/2012 | Thormundsson et al. | 381/71.12 |

FOREIGN PATENT DOCUMENTS

| | | | |
|---|---|---|---|
| DE | 196 36 414 | A1 | 3/1998 |
| EP | 2 259 077 | A1 | 12/2010 |
| GB | 2 308 898 | A | 7/1997 |
| WO | 97/03536 | A1 | 1/1997 |

OTHER PUBLICATIONS

Meher, "New approach to look-up table design and memory-based realization of FIR design filter"; Mar. 2010, IEEE, vol. 57, No. 3; p. 592-603.*

Ding, et. al., "Filter Morphing of Parametric Equalizers and Shelving Filters for Audio Signal Processing," *J. Audio Eng. Soc.*, vol. 43(10):821-826, Oct. 1995.

* cited by examiner

*Primary Examiner* — Vivian Chin
*Assistant Examiner* — David Ton
(74) *Attorney, Agent, or Firm* — Seed IP Law Group PLLC

(57) ABSTRACT

A signal processor including an equalizer responsive to an input signal and to a parameter signal, said equalizer configured to provide an output signal to an electro-acoustical transducer for compensating a frequency response of said electro-acoustical transducer; a transducer element for monitoring at least a physical parameter of said electro-acoustical transducer, said transducer element configured to provide a transducer signal, a processor block responsive to said transducer signal, configured to provide said parameter signal.

27 Claims, 7 Drawing Sheets

SIGNAL PROCESSOR AND METHOD FOR COMPENSATING LOUDSPEAKER AGING PHENOMENA

BACKGROUND

1. Technical Field

The present disclosure relates to a signal processor and a method for compensating loudspeaker aging phenomena.

2. Description of the Related Art

Audio equalization involves performing compensating processes on an audio signal in order to differently affect the amplitude of the signal at various frequency bands. The result is an alteration of the frequency response of a device. Amplitude is generally measured in decibels (dBs) and modifying the amplitude of the signal at different audio bands can greatly affect both a user's audio experience as well as the perceived quality of the signal.

Recently audio equalization has become quite useful and important to overcome the poor frequency response and non-linearity of actual loudspeakers. This happens in a growing number of segments which goes from the TV to the notebook/netbook markets as well as in the mobile, smart-phone, personal multimedia player (PMPs) appliances or in the more recent all-in-one or tablet PCs segment.

Loudspeaker performances, indeed, are strictly related to their mechanical sizes, to the adopted materials and to the surrounding enclosure. The frequency response, in particular, is greatly affected by those elements. For instance, a good response to the lower frequencies can only be achieved with wide speaker sizes and huge resonance chambers. Achieving an overall flat response throughout the typical audio spectrum (e.g., 20 Hz . . . 20 KHz) is quite difficult and only professional equipment, nowadays, is offering such performances.

The continuous trend to reduce the size of portable and hand-held devices, for instance, along with the efforts aiming to reduce the cost of the overall device force manufactures to sacrifice the resulting audio response. Even worst, this happens in times when the capability to play audio contents is becoming a common feature and, therefore, the expected audio performances of such devices are becoming more and more important.

A further evolution negatively affecting audio quality is driven by the more recent LED technology used for the back-light of the screen in place of the widely adopted cold-cathode fluorescent lamp (CCFL). As a result new ultra-thin TV screens are now available off-the-shelf. This all has greatly affected the loudspeaker quality, preventing good audio performances and, therefore, has turned equalization and speaker compensation technologies into a major mean to recover adequate frequency responses. TV manufactures are investing efforts and resources in developing and tuning equalization devices or even more advanced audio enhancements algorithm in order to recover good audio performances. Audio quality has become a major differentiation factor, one of the top most important attributes, and is influencing consumer's television buying decision.

Nowadays various tools and graphical user interfaces greatly helps users to program the equalization parameters but still finding the best tuning is a quite challenging task. Notably such kind of tools are assuming a flat (e.g., 0 dB) frequency response when no equalization filters are applied, irrespective of the actual speaker frequency response.

Even if the equalization parameters are computed and tuned in order to compensate the loudspeaker frequency response, which is far from being flat over frequency, the result is still a static set of parameters. How such equalization parameters will actually perform on different speaker sets is not easy to be predicted due to the variations of the transducer characteristics. Moreover electro-mechanic parameters could change over time modifying the loudspeaker frequency response and the applied static equalization would be quite ineffective to compensate for such variations.

According to the known art, in WO 97/03536 is described a loudspeaker circuit for monitoring both the pressure and the displacement at the speaker diaphragm with a view to developing a related feedback signal. The coupling between the loudspeaker and its environment can be modified by means of filtering the input signal and source acoustic impedance of the speaker.

BRIEF SUMMARY

An embodiment relates to a signal processor and a method for dynamically adapting equalization parameters to the electro-acoustical characteristics of the loudspeakers which could change over time due to various speaker aging phenomena such as deterioration of the parts, inadvertent damaging due to excessive mechanical shocks, repetitive variations in the environmental parameters (e.g., temperature or humidity, etc.).

An embodiment senses the loudspeaker performances and adaptively tunes the equalization parameters in order to restore the optimal audio quality.

In an embodiment, a signal processor and a method dynamically optimize acoustical performances of a loudspeaker and adaptively adjust equalization parameters in case of variation of the transducer electro-acoustical characteristics which could result from different reasons such as speaker aging phenomena or environmental changes.

An embodiment enables an equalizer, preferably a variable multi-band equalizer, to dynamically adapt itself to the actual loudspeaker acoustical characteristics.

An embodiment may be used in a generic multi-channel audio system where the multiple channels could be related, for instance, to different electro-acoustical transducers reproducing each a specific audio sub-band of a monophonic audio source, such as in the case of a two-band sub-woofer/tweeter loudspeaker system.

Moreover an embodiment may be used in a generic multi-channel audio system where speakers being part of the audio system (such as subwoofer, bass, midrange and/or tweeter) are differently performing due to a different deterioration of the transducers (e.g., speaker aging) or variations in the loudspeaker manufacturing process.

An embodiment may comprise automatic balancing of the audio contents between channels in case equalizer parameters of one speaker are preventing this latter from adequately reproducing some frequency band (e.g., because of system intervention for containment of vibration displacement). The affected audio sub-band may be restored through proper enhancement on the other channel. This solution would be especially convenient for the balancing of low frequency contents since, according to the human ear perception criteria, such frequencies are poorly directional.

An embodiment at least partially compensates for inefficiency of one speaker being part of a system of loudspeaker by modification of the equalization parameters of the other channel in the attempt to restore the overall sound image.

An embodiment facilitates preventing excessive vibration displacement of the speaker diaphragm which, if prolonged, could result in the deterioration of the speaker characteristics.

In an embodiment, a signal processor comprises: an equalizer responsive to an input signal and to a parameter signal, said equalizer configured to provide an output signal to an electro-acoustical transducer for compensating a frequency response of said electro-acoustical transducer; a transducer element for monitoring at least a physical parameter of said electro-acoustical transducer, said transducer element configured to provide a transducer signal; and a processor block responsive to said transducer signal, configured to provide said parameter signal. In an embodiment, said processor block comprises: an efficiency detector, responsive to said transducer signal, configured to provide an error detection signal; a parameter calculator, responsive to said error detection signal ($s_{err}$) and configured to provide said parameter signal. In an embodiment, said efficiency detector comprises: at least one integration block responsive to said transducer signal, configured to provide an integrated signal; an error filter responsive to said integrated signal, configured to provide said error detection signal. In an embodiment, the signal processor comprises a level meter block, responsive to said output signal, configured to provide a level meter signal to said efficiency detector. In an embodiment, said efficiency detector comprises: a displacement block responsive to said level meter signal, configured to provide an expected displacement signal; a summation element responsive to said expected displacement signal and to said integrated signal, configured to provide a displacement error signal, said error filter responsive to said displacement error signal, configured to provide said error detection signal. In an embodiment, the signal processor comprises: a band-pass filter, responsive to said output signal, configured to provide a band pass signal; said level meter block, responsive to said band pass signal, configured to provide said level meter signal. In an embodiment, said efficiency detector comprises: a band pass selector configured to provide a control signal; said band-pass filter responsive to said output signal and to said control signal, configured to provide said band pass signal. In an embodiment, said parameter calculator comprises: a compensation filter calculator, responsive to said error detection signal configured to provide a compensated error detection signal; a morphing block, responsive to said compensated error detection signal configured to provide a compensation signal; a coefficient filter calculator, responsive to said a compensation signal configured to provide said parametric signal. In an embodiment, the morphing block comprises a linear morphing block, a plurality of filter memories and a step counter. In an embodiment, the signal processor comprises a power amplifier responsive to said output signal, configured to provide an amplified output signal to said electro-acoustical transducer. In an embodiment, said equalizer is a variable equalizer for adaptively tuning a plurality of equalization parameters in order to compensate the frequency response of said electro-acoustical transducer. In an embodiment, said equalizer is a multiband equalizer. In an embodiment, said multiband equalizer comprises a IIR filter, FIR filter or tuning analog filtering stages. In an embodiment, said electro-acoustical transducer is a loudspeaker. In an embodiment, said transducer element is an accelerometer, acoustic pressure sensor, temperature sensor, diaphragm position sensor or an impedance sensor. In an embodiment, said accelerometer is micro electro-machine motional element.

In an embodiment, an electronic apparatus comprises a central unit, a signal processor, an electro-acoustical transducer and an energy source for power supply to said central unit, said electro-acoustical transducer and said signal processor, said central unit being adapted to control the operation of said signal processor.

In an embodiment, a method comprises providing an input signal and a parametric signal to an equalizer; generating an output signal by said equalizer based on determined compensating filters in response to said input signal and to said parametric signal and providing said output signal to and electro-acoustical transducer; providing a transducer element connected to said electro-acoustical transducer, said transducer element being suitable for monitoring at least a physical parameter of said electro-acoustical transducer; generating a transducer signal by said transducer element and providing said transducer signal to a processor block; generating said parametric signal by said processor block based on determined criterion in response to said transducer signal.

In an embodiment, a computer program product comprises a computer readable storage structure embodying computer program code thereon for execution by a computer processor with said computer program code, characterized in that it includes instructions for performing the steps of any of the methods described herein.

In an embodiment, a signal processor comprises: a multiband equalizer responsive to an input signal and to a parameter signal, said equalizer configured to provide an output signal to an electro-acoustical transducer; a transducer element configured to monitor at least one physical parameter associated with said electro-acoustical transducer, said transducer element configured to provide a transducer signal based on the monitoring; and a processor block configured to provide said parameter signal based on the transducer signal, the processor block including: an efficiency detector configured to provide an error detection signal based on the transducer signal; and a parameter calculator configured to provide said parameter signal based on the error detection signal. In an embodiment, said efficiency detector comprises: at least one integration block configured to provide an integrated signal based on the transducer signal; and an error filter configured to provide said error detection signal based on the integrated signal. In an embodiment, the signal processor comprises a level meter block configured to provide a level meter signal to said efficiency detector based on the output signal. In an embodiment, said efficiency detector comprises: a displacement block configured to provide an expected displacement signal based on the level meter signal; and a summation element configured to receive said expected displacement signal and said integrated signal, and to provide a displacement error signal based on the expected displacement signal and the integrated signal, wherein said error filter is configured to provide said error detection signal based on the displacement error signal. In an embodiment, the signal processor comprises: a band-pass filter configured to provide a band pass signal based on the output signal, wherein said level meter block is configured to provide said level meter signal based on said band pass signal. In an embodiment, said efficiency detector comprises: a band pass selector configured to provide a control signal, wherein said band-pass filter is configured to provide said band pass signal based on the output signal and the control signal. In an embodiment, said parameter calculator comprises: a compensation filter calculator configured to provide a compensated error detection signal based on the error detection signal; a morphing block configured to provide a compensation signal based on the compensated error detection signal; and a coefficient filter calculator configured to provide said parametric signal based on the compensation signal. In an embodiment, the morphing block comprises a linear morphing block, a plurality of filter memories and a step counter. In an embodiment, the signal processor comprises a power amplifier responsive to said output signal, configured to provide an amplified output signal to said electro-acoustical transducer. In an embodiment, said multiband equalizer is a variable equalizer configured to adaptively tune a plurality of equalization parameters based on the parameter signal. In an embodiment, said multiband equalizer comprises at least one of: an IIR filter; a FIR filter; and a tuning analog filtering stage. In an embodiment, said electro-acoustical transducer is a loudspeaker. In an embodiment, said transducer element comprises at least one of: an accelerometer; an acoustic pressure sensor; a temperature sensor; a diaphragm position sensor; and an impedance sensor. In an embodiment, said accelerometer is micro electro-machine motional element.

In an embodiment, a system comprises: an electro-acoustical transducer; a multiband equalizer responsive to an input signal and to a parameter signal, said equalizer configured to provide an output signal to drive the electro-acoustical transducer; a transducer element configured to monitor at least one physical parameter associated with said electro-acoustical transducer and to provide a transducer signal based on the monitoring; an efficiency detector configured to provide an error detection signal based on the transducer signal; and a parameter calculator configured to provide said parameter signal based on the error detection signal. In an embodiment, said efficiency detector comprises: at least one integration block configured to provide an integrated signal based on the transducer signal; and an error filter configured to provide said error detection signal based on the integrated signal. In an embodiment, the system comprises: a level meter block configured to provide a level meter signal to said efficiency detector based on the output signal, wherein said efficiency detector comprises: a displacement block configured to provide an expected displacement signal based on the level meter signal; and a summation element configured to receive said expected displacement signal and said integrated signal, and to provide a displacement error signal based on the expected displacement signal and the integrated signal, wherein said error filter is configured to provide said error detection signal based on the displacement error signal. In an embodiment, the system comprises: a band pass selector configured to provide a control signal; and a band-pass filter configured to provide a band pass signal based on the output signal and the control signal, wherein said level meter block is configured to provide said level meter signal based on said band pass signal. In an embodiment, said parameter calculator comprises: a compensation filter calculator configured to provide a compensated error detection signal based on the error detection signal; a morphing block configured to provide a compensation signal based on the compensated error detection signal, the morphing block including a linear morphing block, a plurality of filter memories and a step counter; and a coefficient filter calculator configured to provide said parametric signal based on the compensation signal. In an embodiment, said transducer element comprises at least one of: an accelerometer; an acoustic pressure sensor; a temperature sensor; a diaphragm position sensor; and an impedance sensor.

In an embodiment, a method comprises: generating an output signal of a multiband equalizer based on one or more compensating filters in response to an input signal and a parametric signal associated with at least one frequency band of the multiband equalizer; driving an electro-acoustical transducer based on the output signal of the multiband equalizer; monitoring at least one physical response of the electro-acoustical transducer to the output signal using a transducer element; generating a transducer element signal based on the monitoring; generating an error detection signal based on the transducer element signal; and generating the parametric signal associated with the at least one frequency band based on the error detection signal. In an embodiment, generating the error detection signal comprises integrating the transducer element signal. In an embodiment, the method comprises selecting a frequency band of the multiband equalizer and generating a parametric signal associated with the selected frequency band. In an embodiment, the method further comprises selecting a second frequency band of the multiband equalizer and generating a second parametric signal associated with the second frequency band.

In an embodiment, a non-transitory computer-readable medium's contents configure a signal processor to perform a method, the method comprising: generating an output signal based on one or more compensating filters in response to an input signal and a parametric signal associated with at least one frequency band of the signal processor; driving an electro-acoustical transducer based on the output signal; monitoring at least one physical response of the electro-acoustical transducer to the output signal; generating a transducer element signal based on the monitoring; generating an error detection signal based on the transducer element signal; and generating the parametric signal associated with the at least one frequency band based on the error detection signal. In an embodiment, the non-transitory computer-readable medium comprises at least one look-up table. In an embodiment, the method comprises: selecting a first frequency band of the signal processor and generating a first parametric signal associated with the first frequency band; and selecting a second frequency band of the signal processor and generating a second parametric signal associated with the second frequency band.

In an embodiment, a system comprises: means for generating driving signals for an electro-acoustical transducer in response to input signals and parametric signals; means for monitoring physical responses of the electro-acoustical transducer to driving signals; means for generating error detection signals based on an output of the means for monitoring; and means for generating parametric signals based on the error detection signals, the parametric signals being associated with respective frequency bands of the means for generating driving signals. In an embodiment, the system comprises means for selecting at least one frequency band of the means for generating driving signals wherein the means for generating parametric signals is configured to generate at least one parametric signal associated with the selected at least one frequency band. In an embodiment, the means for generating error detection signals comprises at least one integrator and at least one summation element.

BRIEF DESCRIPTION OF THE SEVERAL VIEWS OF THE DRAWINGS

The various characteristics and advantages of various embodiment will appear from the following detailed description of a practical embodiment, illustrated as a non-limiting example in the set of drawings, in which.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, intergrators, transducers, filters, etc., are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 6:
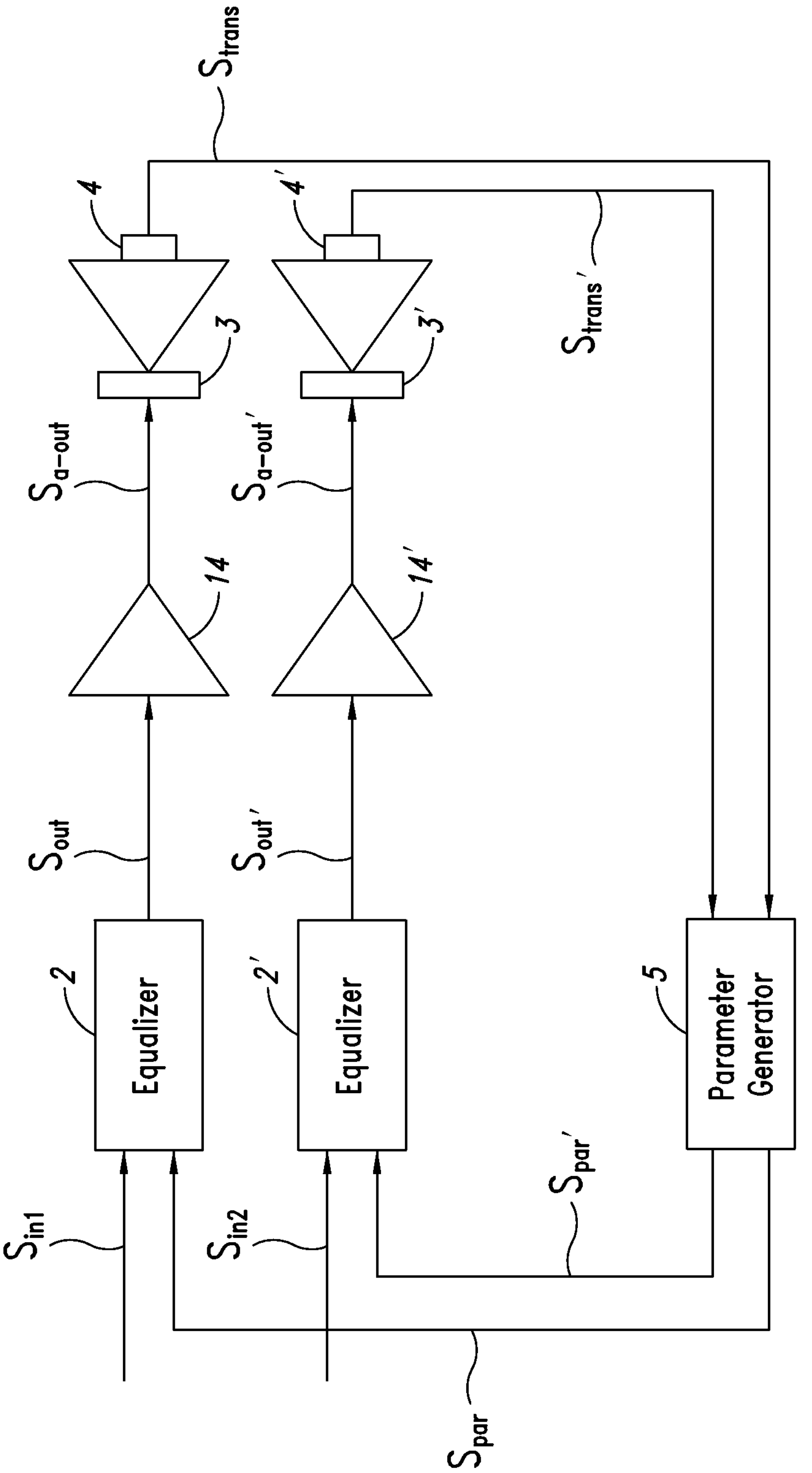
FIG. 6 shows an of signal processor suitable for use, for example, in the embodiment of FIG. 1 implemented in a generic multi-channel audio system.

With reference to appended Figures is described a signal processor 1 and a method to improve acoustical performances of an electro-acoustical transducer 3 (or of a multi-channel audio system, see FIG. 6).

Particularly in one embodiment the signal processor and method are suitable for adaptively compensating the frequency response of the transducer electro-acoustical 3 in case of variation of the characteristics of the same transducer electro-acoustical. Such variations could result from different reasons such as speaker aging phenomena or environmental changes.

It is to be noted that the electro-acoustical transducers 3 or loudspeakers are devices for converting an electrical or digital audio signal into an electro-acoustical signal.

The various blocks of the signal processor 1 may be implemented as software or firmware for execution by a processor. Yet both digital and analog implementations are possible. Each element of the signal processor 1 or step of the method may be implemented in hardware, software, or a combination thereof.

In particular, in the case of firmware or software implementation, the method can be provided as a computer program that when executed configures a processor to perform a method as described herein.

The method can also be embodied as computer readable code on a computer readable medium. It is to be noted that the computer readable medium includes any data storage device that can store data, which can thereafter be read by a computer system. Examples of the computer readable medium include read-only memory, random-access memory, CD-ROMs, DVDs, magnetic tape, optical data storage devices and carries waves. The computer readable medium can also be distributed over network-coupled computer systems so that the computer readable code is stored and executed in a distributed fashion.

Figure 1:
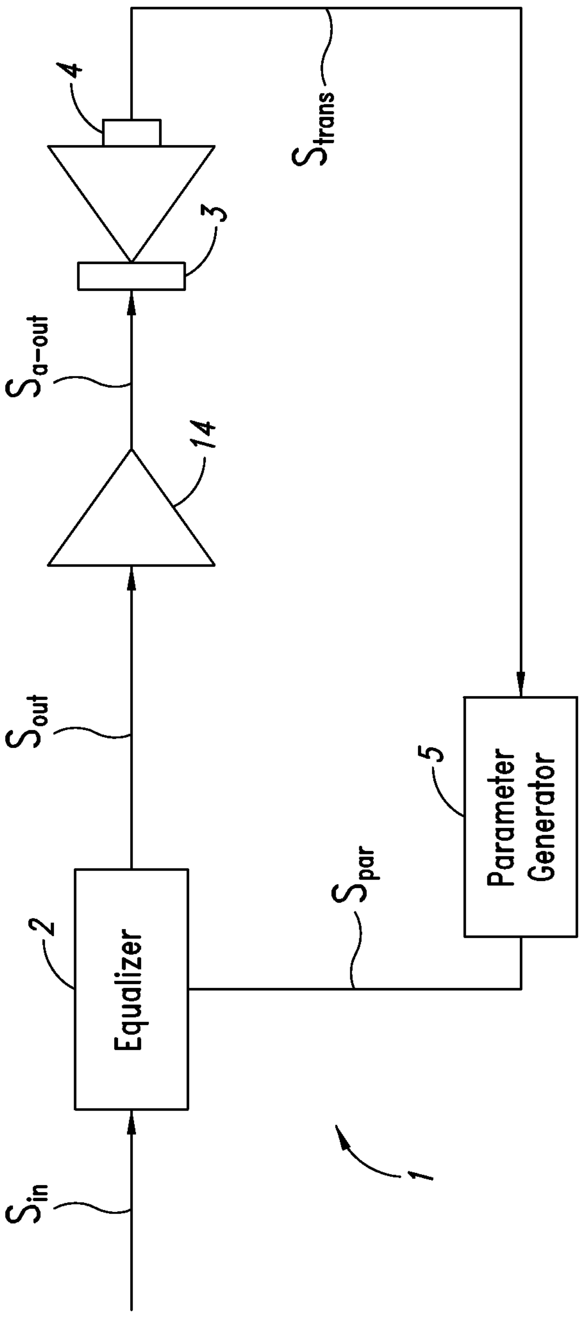
FIG. 1 is an embodiment of a signal processor and a loudspeaker arrangement.

In view of the above and with reference to FIG. 1, the signal processor 1 according to one embodiment comprises:

- an equalizer 2 responsive to an input signal $s_{in}$ and to a parameter signal $s_{par}$, said equalizer 2 configured to provide an output signal $s_{out}$ to the electro-acoustical transducer 3 (or loudspeaker) for compensating a frequency response of electro-acoustical transducer itself;
- a transducer element 4 configured to monitor at least one physical parameter associated with the electro-acoustical transducer 3, said transducer element 4 configured to provide a transducer signal $s_{trans}$,
- a parameter generator processor block 5 configured to respond to the transducer signal $s_{trans}$, and configured to provide said parameter signal $s_{par}$.

The input signal $s_{in}$ is an electro-acoustical signal and it can be a digital signal, according to one embodiment.

Variable Multi-Band Equalizer

The equalizer 2, may be an active equalizer, and as a function of the input signal $s_{in}$ and of the parametric signal $s_{par}$ is configured to compensate for the frequency response of electro-acoustical transducer 3.

To this end the equalizer 2 has a plurality of equalization parameters that can be tuned in order to compensate the frequency response of electro-acoustical transducer 3.

In other words the equalizer 2 is a variable equalizer that adaptively tunes a plurality of equalization parameters to compensate for the frequency response of electro-acoustical transducer 3.

Particularly the equalizer 2 amplifies or attenuates in a defined frequency band the input signal $s_{in}$ as a function of the parametric signal $s_{par}$, e.g., as a function of the detected physical characteristics of the electro-acoustical transducer 3.

The defined frequency band represents for example the low frequencies, the middle frequencies or the high frequencies of the frequency response of the electro-acoustical transducer 3. The defined frequency band(s) may be predefined.

The frequency response of the electro-acoustical transducer 3 may be, for example, variable between 20 Hz and 20 KHz.

For example the equalizer 2 amplifies or attenuates linearly in the low frequencies, the input signal $s_{in}$ in function of the parametric signal $s_{par}$.

The plurality of equalization parameters of the variable equalizer 2 which are tuned by the parametric signal $s_{par}$ comprise frequency (f), gain (g) and/q-factor (q).

In order to better compensate the frequency response of electro-acoustical transducer 3, the variable equalizer 2 in an embodiment is a variable multi-band equalizer.

The variable multi-band equalizer 2 is suitable for performing compensating processes on input signal $s_{in}$ based on the parametric signal $s_{par}$ in order to differently affect the amplitude of the signal $s_{in}$ at various frequency bands, such as in the low frequencies, in the middle frequencies and/or in the high frequencies.

The result is an alteration of the frequency response of the loudspeaker 3 in function of the retrieved transducer signal $s_{trans}$.

For example the variable multi-band equalizer 2 can modify the amplitude of the input signal $s_{in}$ at different audio bands so as to greatly affect the audible signal emitted by the loudspeaker 3.

Figure 8:
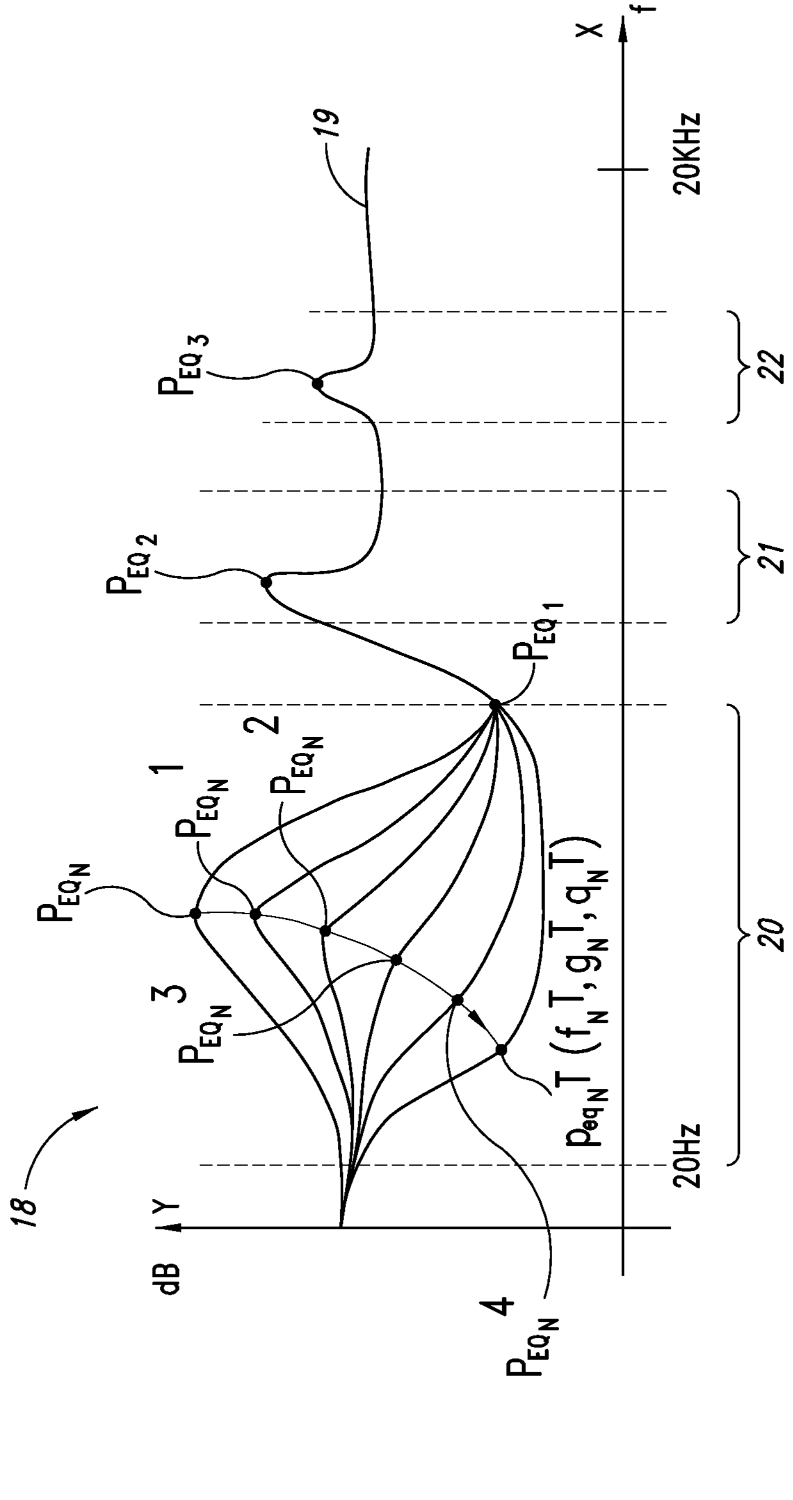
FIG. 8 shows a frequency response of an embodiment of a loudspeaker as used in FIG. 1.

In fact with reference to FIG. 8, wherein it is depicted a graph 18, comprising an "x" axis represents the frequency response of the loudspeaker 3, variable from 20 Hz to 20 KHz and an "y" axis represents the gain in dB, of an overall frequency response 19 of loudspeaker 3 compensative curve, it is possible note that the variable multi-band equalizer 2 compensates said frequency response 19, for example, only in the low frequency audio band 20 and not in the other bands 21, 22.

However it is possible that the variable multi-band equalizer 2 can compensate also in the other audio bands 21 and/or 22.

To this end different forms of variable multi-band equalizer 2 can be adopted, analog or digital.

A digital implantation of the variable multi-band equalizer 2 may be preferred for some applications. Particularly the variable multi-band equalizer 2 may be implemented by means of either infinite-impulse-response (IIR) or finite-impulse-response (FIR) filters.

In an embodiment the variable multi-band equalizer 2 is implemented by a digital infinite-impulse-response (IIR) filtering stage.

In this scenario, the variable multi-band equalizer 2 can be depicted and functionally controlled through a variable number of control points $P_{EQ1}$, $P_{EQ2}$, $P_{EQ3}$, $P_{EQN}$ (PEQ point-Parametric EQ), each one representing a specific IIR filtering stage. The overall frequency response 18 of the loudspeaker 3 is the summation of the effects produced by each single PEQ filter on the input signal $s_{in}$ (e.g., the electro acoustical signal).

The variable multi-band equalizer 2 can be loaded with the control points $P_{EQ1}$, $P_{EQ2}$, $P_{EQ3}$, $P_{EQN}$ (see for example the control signal $s_{chk}$ depicted in FIG. 7) as default filter parameters in such a way to compensate the frequency response of the loudspeaker 3.

By means of the parametric signal $s_{par}$ the parameters of the variable multi-band equalizer 2 will dynamically evolve in accordance with the electro-acoustical transducer 3 characteristics and performances and transition from one state (e.g., $P_{EQN}$) to the next one (e.g., $P_{EQN}^1$) will happen through a number of intermediate steps so as to minimize the presence of audible artifacts. The steps and the number of steps may be selectable and/or programmable.

In fact, as described in detail in the following description with reference to FIG. 4, it has been proved that a sufficient number of intermediate steps can avoid such artifacts by means, for example, of a linear morphing PEQ adaptation process.

The number of desired steps depends on the variations of the computable PEQ filters. As few as 10~20 steps have proved adequate results in most cases (by using a 10 PEQs equalizer stage).

The transducer element 4 may be mounted on the speaker diaphragm of the loudspeaker for sensing at least a physical parameter associated with the loudspeaker 3 and related to the speaker operating condition.

In an embodiment the transducer element 4 is a motional transducer element e.g., an accelerometer and it is secured to the moving coil of the loudspeaker.

In an embodiment, the motional transducer element is positioned directly in line with the coil of loudspeaker so as to respond directly proportionately to the coil movement.

In an embodiment the motional transducer element is implemented with a micro electro-machine motional element (MEM).

Alternatively the transducer element 4 can be implemented as an acoustic pressure sensor, temperature sensor, diaphragm position sensor or impedance (e.g., I/V) sensor, etc., and various combinations thereof.

For example, it is to be noted that the transducer element 4 can be a combination of a motional transducer element and one or more of the acoustic pressure sensor, temperature sensor, diaphragm position sensor or impedance (e.g., I/V) sensor.

In the following description, without loss of generality, the transducer element 4 is described with reference to the motional transducer element e.g., with reference to an accelerometer.

Parameter Generator Processor Block 5

Figure 2:
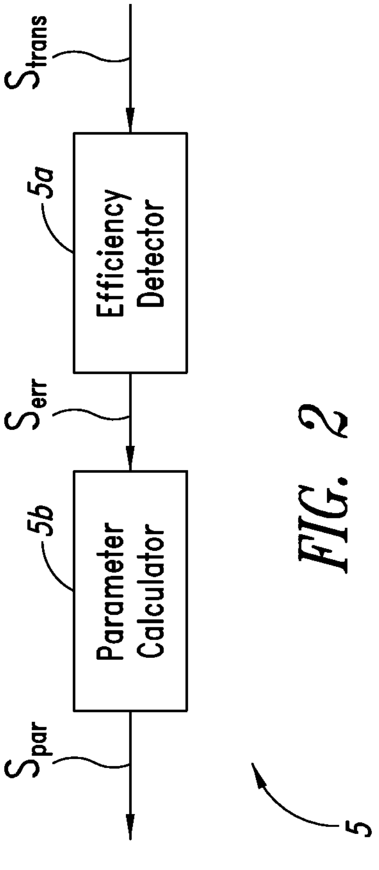
FIG. 2 shows in more detail an embodiment of a parameter generator suitable for use, for example, in the embodiment of FIG. 1.

Now with reference to FIG. 2, the processor block 5 comprises:

- an efficiency detector 5A, responsive to said transducer signal $s_{trans}$, configured to provide an error detection signal $s_{err}$;
- a parameter calculator 5B, responsive to said error detection signal $s_{err}$ and configured to provide said parameter signal $s_{par}$.

Efficiency Detector 5A

The accelerometer information, e.g., the signal $s_{trans}$ outputted by the transducer element 4, is processed by the efficiency detector 5A in order to produce a displacement information so as to compensate for the frequency response of the loudspeaker 3.

Various implementations of this efficiency detector 5A could be possible and selected depending on the number of channels available, characteristics of the accelerometers adopted and nature of the audio system (monophonic two-band loudspeaker, stereophonic speakers, etc.).

Figure 5:
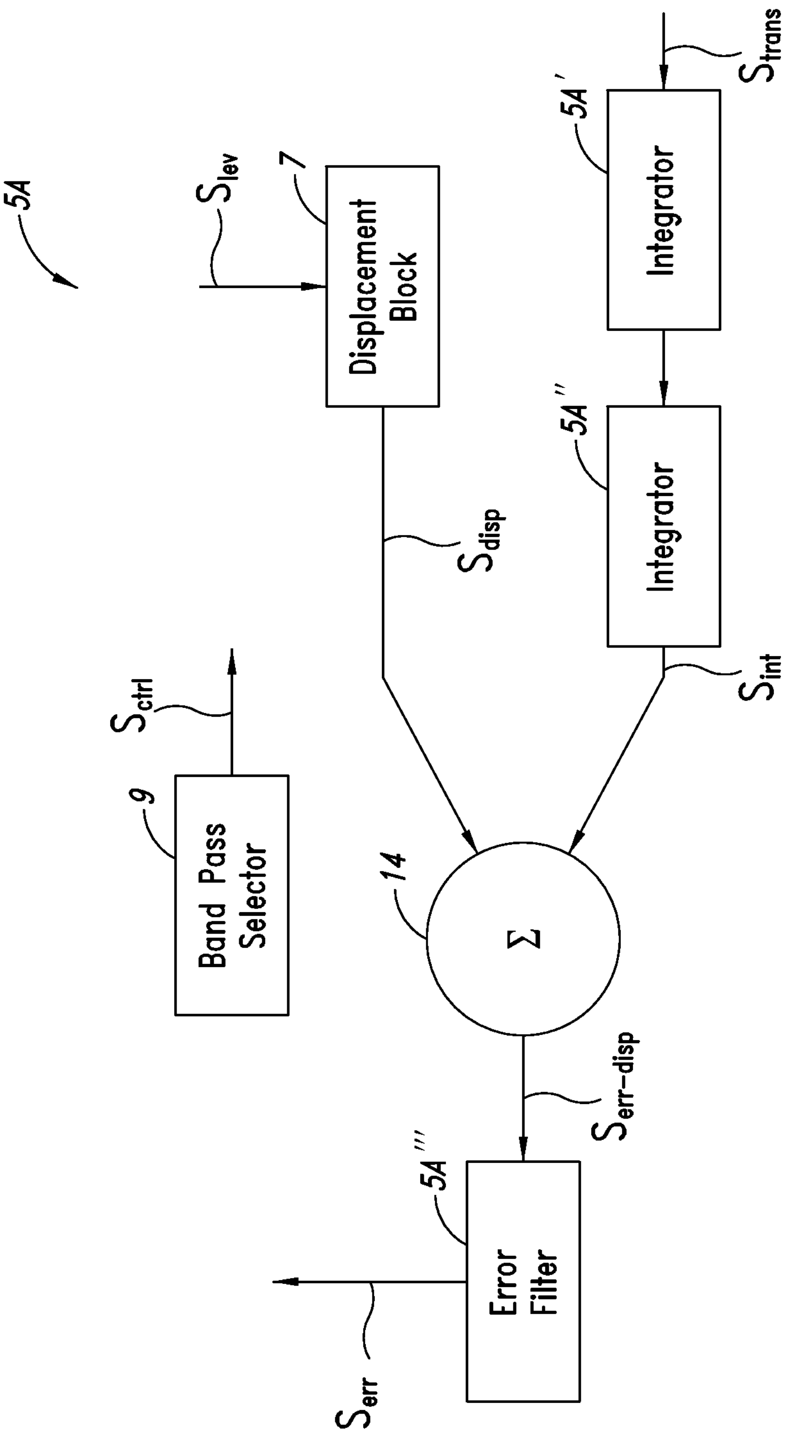
FIG. 5 shows in more detail an embodiment of an efficiency detector suitable for use, for example, in the embodiment of FIG. 2.

In an embodiment, the efficiency detector 5A comprises, with reference to FIGS. 2 and 5:

- at least an integration block 5A', 5A" responsive to said transducer signal $s_{trans}$, configured to provide an integrated signal $s_{int}$; Double fold integration block 5A', 5A" is configured to produce a $s_{int}$ signal in accordance with the loudspeaker diaphragm displacement.
- an error filter 5A'", responsive to said integrated signal $s_{int}$, configured to provide said error detection signal $s_{err}$; various implementations of the error filter 5A'" can be adopted depending, for example, on the nature of the motional sensor 4, characteristics of the loudspeaker 3 driven.

Figure 3:
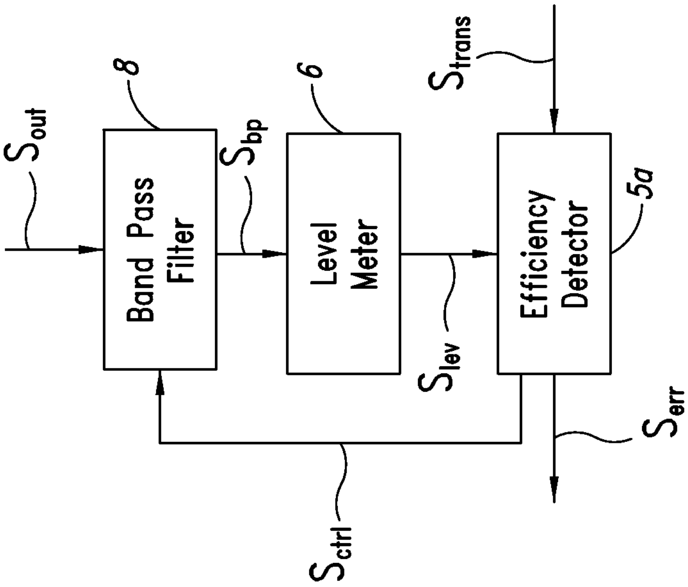
FIG. 3 is a partial view of an embodiment of a signal processor and loudspeaker arrangement.

Now with reference to FIG. 3, the signal processor 1 can comprise:

- a level meter block 6, responsive to said output signal $s_{out}$, configured to provide a level meter signal $s_{lev}$; the level meter block 6 is capable to measure either peak and/or rms values of the output signal $s_{out}$.

The level meter block 6 is suitable for measuring signal energy of the output signal $s_{out}$.

The level meter signal $s_{lev}$ is provided to the efficiency detector 5A.

To this end the efficiency detector 5A can also comprise a displacement block 7 (see FIG. 5) responsive to said level meter signal $s_{lev}$, configured to provide an expected displacement signal $s_{disp}$.

The efficiency detector 5A can also comprises a summation element 14 responsive to said expected displacement signal $s_{disp}$ and to said integrated signal $s_{int}$, configured to provide a displacement error signal $s_{err\text{-}disp}$.

The summation element 14 subtracts the expected loudspeaker displacement signal $s_{disp}$ from the measured displacement value (e.g., the signal $s_{int}$) and thus producing a displacement error signal $s_{err\text{-}disp}$.

The error filter 5A'" is responsive to said displacement error signal $s_{err\text{-}disp}$ and configured to provide said error detection signal $s_{err}$.

Particularly, also with reference to FIG. 5, the efficiency detector 5A would basically compare the transducer signal $s_{trans}$ with a reference one $s_{disp}$, as produced by an ideal loudspeaker model.

Yet another form of the present embodiment could rely only on the level signal $s_{lev}$ (e.g., the volume, the peak or the rms measurement of the output signal $s_{out}$), thus not implying any loudspeaker transducer element 4.

Referring again to FIG. 3, the signal processor 1 can comprise a band-pass filter 8, responsive to said output signal $s_{out}$, configured to provide a band pass signal $s_{bp}$. In other words the band-pass filter 8 provides a sub-band filtering for the output signal $s_{out}$.

The level meter block 6 is responsive to said band pass signal $s_{bp}$ and configured to provide said level meter signal $s_{lev}$.

Therefore the level meter block 6 is suitable for measuring signal energy of the output signal $s_{out}$ in the specific sub-band frequency imposed by the band pass filter 8.

The efficiency detector 5A can comprise a band pass selector 9 configured to provide a control signal $s_{ctrl}$, being said band-pass filter 8 responsive to said output signal $s_{out}$ and to said control signal $s_{ctrl}$, configured to provide said band pass signal $s_{bp}$.

Thanks to the control signal $s_{ctrl}$ the band-pass filter 8 can be implemented as an adjustable band-pass filter placed on the signal path which feeds the level meter block 6; particularly the band of such filter 8 may be tuned to obtain a good correlation versus the information retrieved from the accelerometer 4, typically band-limited.

It is to be noted also that the band-pass filter 8 could also be differently tuned at regular intervals in order to extract signal level information at different audio sub-bands, then useful for the specific implementation of the detector algorithm.

The band pass selector 9 operates in accordance with the parameter calculator block 5B in order to measure, compute and update the Nth PEQ filter of the variable multi-band equalizer 2.

The control signal $s_{ctrl}$ controls the sub-band filter 8 feeding the peak/rms level meter 6. Selectable bands could be restricted to the optimal operative range of the adopted motional sensor 4.

The error filter 5A''' responsive to the signal $s_{err-disp}$ coming from the summation element 14 and configured to provided the signal $s_{err}$, the latter is in turn fed to the subsequent parameter calculator 5B.

The displacement block 7 is a loudspeaker equivalent model able to provide the expected displacement value based on the measured peak/rms level as sensed on the sub-band block 8 filtered output signal $s_{out}$.

The loudspeaker efficiency detector 5A would basically compare the measured displacement signal $s_{int}$ with a reference one $s_{disp}$, as produced by an ideal loudspeaker model 7 fed with a sub-band filtered peak/rms level signal $s_{lev}$. The error signal $s_{err-disp}$ would be negligible or small in case a perfect or quasi-ideal loudspeaker 3 (with reference to the selected loudspeaker model).

Loudspeaker aging phenomena or performance deterioration would gradually produce an increasing error signal $s_{err-disp}$ then used to produce a convenient filtered error signal $s_{err}$ fed to the subsequent parameter calculator block 5B, an embodiment of which is hereinafter described in detail.

The efficiency detector block 5A is capable to distinguish between moderate and severe loudspeaker deterioration or efficiency drop and, in case, signal the system through a failure event.

This could be useful to facilitate preventing further damages of the overall audio system by injection of excessive signal power in the tentative to restore the original audio loudness.

Calculator Block 5B

Figure 4:
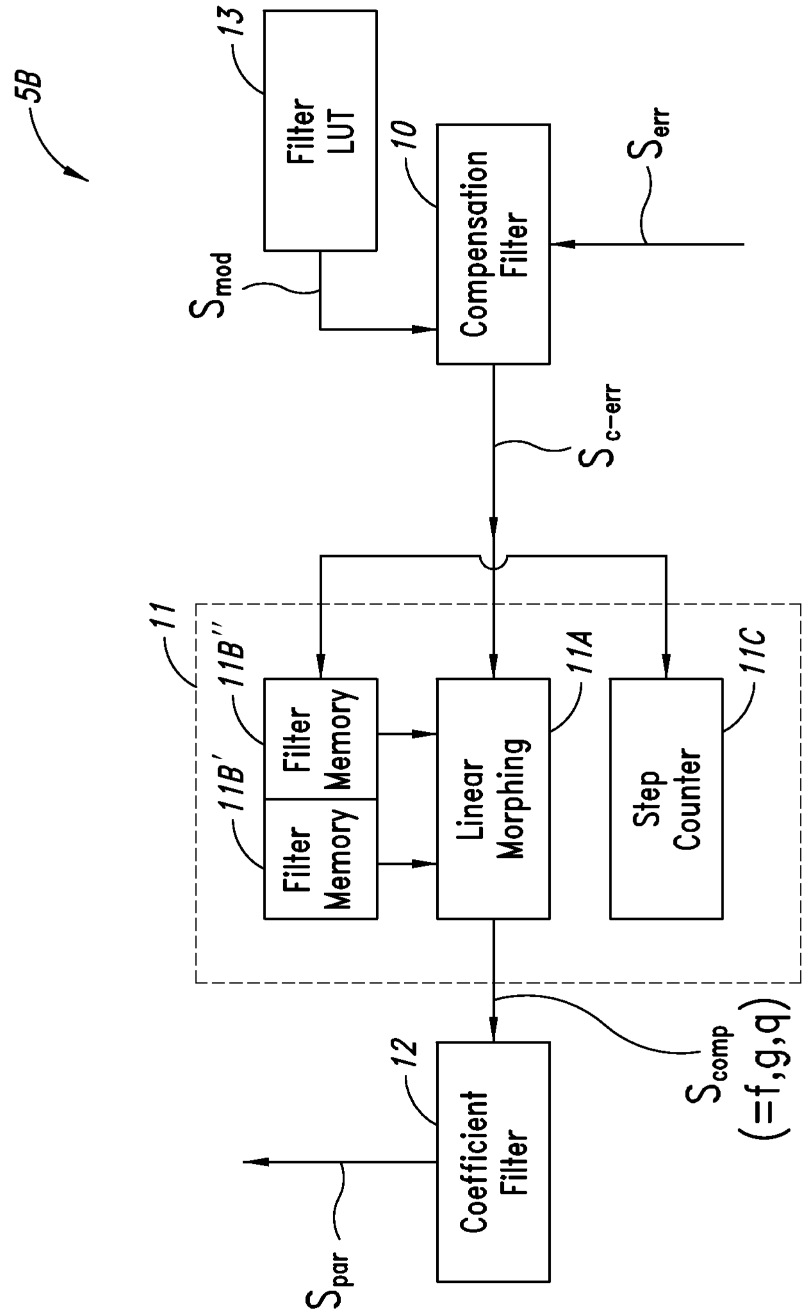
FIG. 4 shows in more detail an embodiment of a parameter calculator suitable for use, for example, in the embodiment of FIG. 2.

Referring now to FIG. 4, the parameter calculator block 5B comprises:

- a compensation filter calculator 10, responsive to said error detection signal $s_{err}$ configured to provide a compensated error detection signal $S_{c-err}$.
- a morphing block 11, responsive to said compensated error detection signal $s_{c-err}$, configured to provide a compensation signal $s_{comp}$;
- a coefficient filter calculator 12, responsive to said a compensation signal $s_{comp}$, configured to provide said parametric signal $s_{par}$.

A suitable compensation filter 10 can be computed based on the information of the filtered error signal $s_{err}$ in such a way that applied to the variable multi-band equalizer 2 can further process the electro-acoustical signal in order to minimize the filtered error signal itself.

The morphing block 11 comprises a linear morphing block 11A, a plurality of filter memories 11B', 11B'' and a step counter 11C.

The filter memory 11B' is the current compensation filter storage element $PEQ_N$, and may be computed off-line and pre-stored before the electronic apparatus (see FIG. 7) is powered-up, previously computed by the compensation filter 10 and then stored here upon completion of the linear morphing transition, etc.

The filter memory 11B'' is the target compensation filter storage element $PEQ^T_N$, loaded by the compensation filter 10 once a new filter is available through the signal $s_{c-err}$.

The step counter 11C is used by the linear morphing block 11A and it is programmable with a variable number of steps. The more steps are programmed the smoother will be the filter transition. The step signal is feed to the linear morphing block 11A in order to compute next filter transition step. Once the step counter is over the target $PEQ^T_N$ filter is stored into the default $PEQ_N$ storage element.

Particularly the linear morphing block 11A allows modifying the default compensation filter $PEQ_N$ towards the target filter reference $PEQ^T_N$ through different steps. Filter memories can typically store the filters $PEQ_N$ and $PEQ^T_N$ in a parametric format such as frequency (f), gain (g) and q-factor (q). Such storing format makes it more convenient to gradually step the default filter towards the target one by an interpolation algorithm and through the step counter 11C with a defined number of steps.

Advantageously, as depicted in audio band 20 of FIG. 8, stepping through adjacent filters $PEQ_N^1, \ldots, PEQ_N$ enable a smooth transition from the default $PEQ_N$ to the target filter $PEQ^T_N$ without any audible artifacts.

The coefficient filter calculator 12 calculates the filter coefficients $PEQ_N$ starting from the parametric information provided by the linear morphing block 11A.

In case IIR filters are adopted, for instance, it becomes convenient to convert parametric information such as frequency (f), gain (g) and q-factor (q) into coefficients then loaded into the Nth filter of the variable multi-band equalizer 2.

The parameter calculator 5B can comprise a look-up filter table 13 configured to provide to the compensation filter calculator 10 a filter models signal $s_{mod}$.

The look-up filter table 13 may be implemented, for example, as a pre-loaded look-up filter table.

Therefore, the compensation filter 10 can be selected from the pre-loaded look-up filter table 13 using the information of the filtered error signal $s_{err}$ as a selector for the proper table entry. For example the selection can be based on a thresholds-based criteria.

Once a new compensation filter 10 is either computed or selected it will be loaded into the $PEQ^T_N$ memory storage element as a target filter reference, the step counter will be reset and the linear morphing process will be started.

The parameter block 5B described in this embodiment, in synthesis, is capable to elaborate the incoming error signal $s_{err}$ as produced by the loudspeaker efficiency detector 5A, and either calculate or select the compensation filter 10. This latter filter 10, conveniently described in the form of frequency (f), gain (g) and q-factor (q) is then further elaborated to compute the actual filter coefficients loaded into the variable multi-band equalizer 2 through the control signal $s_{par}$.

A smooth transition from the currently adopted filter $PEQ_N$ to the target one $PEQ^T_N$, is achieved through the linear morphing block 11A.

The whole morphing block 11 may operate on a single PEQ filter of the variable multi-band equalizer (for instance, the filter Nth) or on more PEQ filters through iteration across the different available PEQ filters in accordance with the sub-band selector block 9.

The parameter calculator 5B is configured to smoothly adapt filter parameters f, g, Q of the filter 12 according to the fed performance efficiency parameter, as measured by the efficiency detector block 5A by means of an error signal $s_{err}$. Putting in relation these latter parameters (freq, gain, Q-factor) with such relevant performance efficiency parameter is a convenient way to smoothly adapt equalization filters.

It is to be noted that if the band pass 8 is implemented in the signal processor 1, just the filters pertaining to the relevant sub-band imposed by the band pass 8 may be involved in such computation, preserving other loudspeaker compensation filters unaltered.

The result would be a gentle and smooth transition of the filter parameters (morphing) from one state to the next one thus offering the following advantages of unlimited number of equalization steps, huge saving of required storing memory, continuous adaptation between the different equalization settings, reduced or no audible artifact and simpler configurability (no huge preset files to be designed).

Such morphing technique for the equalization filters could be adopted even if the transducer element 4 doesn't offer a continuous reading of some physical parameter of the loudspeaker 3: this could be the case of a generic toggling sensor detecting trespassing of some critical threshold (diaphragm displacement, temperature, voice-coil impedance) and sending feedback information in the form of a warning message instead of a continuously variable parameter.

A morphing technique could also be conveniently used in the case a transition between two greatly different equalization filters is required: an abrupt transition between the two filter would likely produce audible artifacts whereas a gentle morphing of the filter parameters would grant smooth adaptation and therefore avoid artifacts.

In case of a digital IIR filtering implementation of the variable multi-band equalizer 2, the parameter calculator block 5B can be tailored for generic bi-quadratic IIR filters or, more specifically, for a low-shelving filter.

Advantageously the low-shelving filter could be adopted to modulate the gain in the lowest audio frequencies, typically responsible for harmful vibration displacement of both diaphragm and enclosure assembly.

The signal processor 1 comprises a power amplifier 14 responsive to said output signal $s_{out}$, configured to provide an amplified output signal $s_{a\text{-}out}$ to said electro-acoustical transducer 3.

Low-shelving filters may be used, for instance, to modulate the efficiency of the loudspeaker in the reproduction of low-frequency contents. It could be of interest to avoid vibrations of the overall application enclosure (for instance, in a smartphone or other hand-held device) by adaptively lowering the gain of the low-shelving filter in the event excessive vibrations are sensed by the accelerometers.

Way of Working of the Signal Processor 1

In an embodiment, the signal processor 1 is based on the signal $s_{trans}$ generated by the transducer element 3 (in the case the transducer element 3 is a motional transducer element, the physical information retrieved is the acceleration) and, on the signal $s_{lev}$ outputted by the peak/rms level block 6.

The transducer element 3 signal $s_{trans}$ is filtered and processed by the processor block 5 in order to obtain a parametric signal $s_{par}$ acting as a controller signal of the variable multi-band equalization 2 so as to compensate the loudspeaker frequency response.

By means of this parametric signal $s_{par}$ the equalizer parameters of the variable multi-band equalization 2 will dynamically evolve in accordance with loudspeaker characteristics and performances.

In an embodiment, this parametric signal $s_{par}$ is achieved by:

$1^{st}$: providing the signal error $s_{err}$ which represents the displacement information for the loudspeaker diaphragm. Such signal error $s_{err}$ is based on the actual displacement information signal $s_{int}$ and, preferably, also based on the ideal information signal $s_{disp}$ (due to the measurement of the signal level $s_{lev}$ in the sub-band of the band pass filter 8);

$2^{nd}$: elaborating the signal $s_{err}$ by means of calculating or selecting the compensation filter 10. This latter compensation filter 10 is then further elaborated by the linear morphing block 11 to compute the actual filter coefficients loaded into the variable multi-band equalizer 2.

With reference now to FIG. 6, it is described a further embodiment of signal processor of FIG. 1 when implemented in a generic multi-channel audio system.

The generic multi-channel audio system shown in FIG. 6 is for example a stereo audio system:

The first loudspeaker 3 is responsive to a first input signal $s_{in1}$ which is in turn equalized by its own equalizer 2; the second loudspeaker 3' is responsive to a second input signal $s_{in2}$ which is in turn equalized by its own equalizer 2'.

Each loudspeaker 3, 3' has its own transducer element 4 and 4', respectively. The transducer signal $s_{trans}$ and $s_{trans'}$ outputted by the respective transducer element 4 and 4' are elaborated by the processor block 5, which is configured to provide a respective parametric signal $s_{par}$ and $s_{par'}$.

The parametric signal $s_{par}$ and $s_{par'}$ is feed to the equalizer 2, 2', respectively.

In case of the first and second loudspeakers differently perform due to a different deterioration of the transducers (e.g., speaker aging) or variations in the loudspeaker manufacturing process, it is possible to achieve and adaptive equalization of the independent audio signals $s_{in1}$, $s_{in2}$.

It is to be noted that, if needed, in a different implementation (such as a two-band sub-woofer/tweeter loudspeaker system), part of the audio frequencies of one channel could be emphasized by the other channel, maybe feeding a more suitable speaker, in order to overcome speaker deterioration and preserve overall audio performance or just as the result of an automatic band splitting optimization algorithm in multi-channel loudspeaker enclosures.

Figure 7:
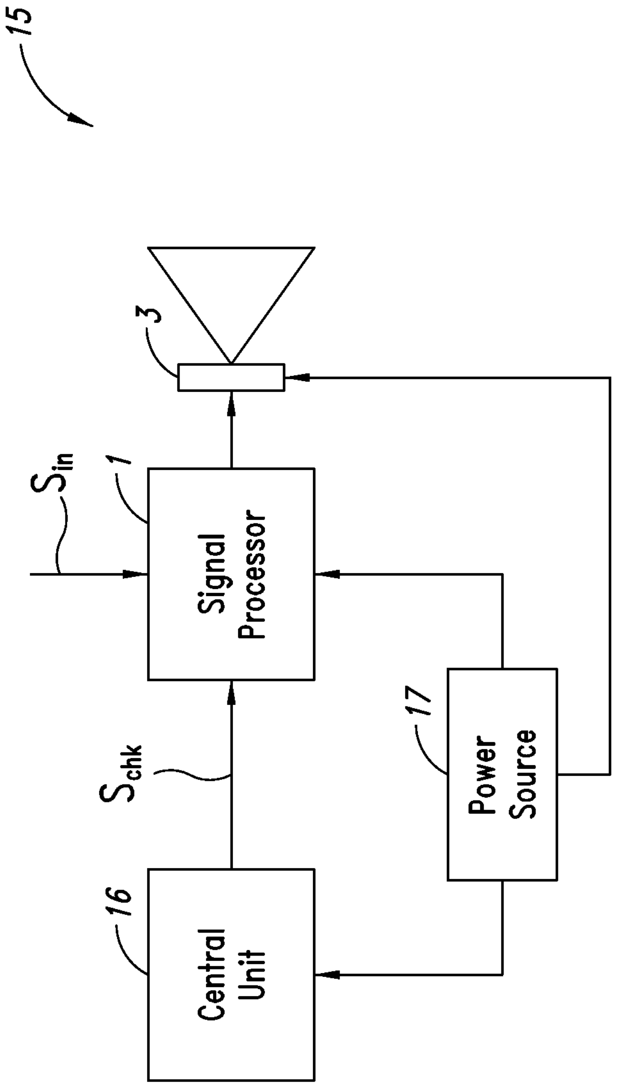
FIG. 7 shows an embodiment of an electronic apparatus comprising the signal processor and loudspeaker arrangement of FIG. 1.

With reference to FIG. 7, it is described an example of electronic apparatus 15 such as portable and hand-held devices (mp3 player, audio recorder, wired or wireless phone, mobile phone, etc.), television apparatus, radio apparatus, personal computers (such as netbook, notebook, flybook, etc.) and the like.

The electronic apparatus 15 comprises a central unit 16, a signal processor 1, an electro-acoustical transducer 3 and an energy source 17 configured to supply power to the central unit 15, the electro-acoustical transducer 3 and said signal processor 1.

The central unit 16 is adapted to control the operation of the signal processor 1 by proving a control signal $c_{chk}$ suitable for pre-charging the equalization parameters in the signal processor.

The signal input $s_{in}$ can be originated by means of any audio signal source.

Many features and advantages of embodiments of the present disclosure are apparent from the written description. Further, since numerous modifications and changes will readily occur to those skilled in the art, the disclosure should not be limited to the exact construction and operation as illustrated and described. Hence, all suitable modifications and equivalents may be resorted to as falling within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A signal processor comprising:

a multiband equalizer responsive to an input signal and to parametric signals corresponding to frequency bands of the multiband equalizer, said equalizer configured to provide an output signal to an electro-acoustical transducer;

a transducer element configured to monitor at least one physical parameter associated with said electro-acoustical transducer, said transducer element configured to provide a transducer signal based on the monitoring;

processing circuitry, which, in operation:

generates an error detection signal based on the transducer signal; and generates said parametric signals based on the error detection signal, wherein said processing circuitry comprises:

at least one integration block configured to provide an integrated signal based on the transducer signal; and an error filter configured to provide said error detection signal based on the integrated signal; and a level meter, which, in operation provides a level meter signal to said processing circuitry based on the output signal.

2. The signal processor according to claim 1 wherein said processing circuitry comprises:

a displacement block configured to provide an expected displacement signal based on the level meter signal; and a summation element configured to receive said expected displacement signal and said integrated signal, and to provide a displacement error signal based on the expected displacement signal and the integrated signal, wherein said error filter is configured to provide said error detection signal based on the displacement error signal.

3. The signal processor of claim 1, comprising:

a band-pass filter configured to provide a band pass signal based on the output signal, wherein said level meter is configured to provide said level meter signal based on said band pass signal.

4. The signal processor according to claim 3 wherein said processing circuitry comprises:

a band pass selector configured to provide a control signal, wherein said band-pass filter is configured to provide said band pass signal based on the output signal and the control signal.

5. The signal processor according to claim 1, comprising a power amplifier responsive to said output signal, configured to provide an amplified output signal to said electro-acoustical transducer.

6. The signal processor according to claim 1 wherein said multiband equalizer is a variable equalizer configured to adaptively tune a plurality of equalization parameters based on the parametric signals.

7. The signal processor according to claim 1 wherein said multiband equalizer comprises at least one of: an IIR filter; a FIR filter; and a tuning analog filtering stage.

8. The signal processor according to claim 1 wherein said electro-acoustical transducer is a loudspeaker.

9. The signal processor according to claim 1 wherein said transducer element comprises at least one of: an accelerometer; an acoustic pressure sensor; a temperature sensor; a diaphragm position sensor; and an impedance sensor.

10. The signal processor according to claim 9 wherein said accelerometer is micro electro-machine motional element.

11. A signal processor comprising:

a multiband equalizer responsive to an input signal and to parametric signals corresponding to frequency bands of the multiband equalizer, said equalizer configured to provide an output signal to an electro-acoustical transducer;

a transducer element configured to monitor at least one physical parameter associated with said electro-acoustical transducer, said transducer element configured to provide a transducer signal based on the monitoring; and processing circuitry, which, in operation:

generates an error detection signal based on the transducer signal; and generates said parametric signals based on the error detection signal, wherein said processing circuitry comprises:

a compensation filter calculator configured to provide a compensated error detection signal based on the error detection signal;

a morphing block configured to provide a compensation signal based on the compensated error detection signal; and a coefficient filter calculator configured to provide said parametric signals based on the compensation signal.

12. The signal processor according to claim 11 wherein the morphing block comprises a linear morphing block, a plurality of filter memories and a step counter.

13. The signal processor according to claim 11 wherein said multiband equalizer is a variable equalizer configured to adaptively tune a plurality of equalization parameters based on the parametric signals.

14. The signal processor according to claim 11 wherein said transducer element comprises at least one of: an accelerometer; an acoustic pressure sensor; a temperature sensor; a diaphragm position sensor; and an impedance sensor.

15. The signal processor according to claim 11 wherein said transducer comprises an accelerometer having a micro electro-machine motional element.

16. A system, comprising:
an electro-acoustical transducer;
a multiband equalizer responsive to an input signal and to frequency-band parametric signals, said equalizer configured to provide an output signal to drive the electro-acoustical transducer;
a transducer element configured to monitor at least one physical parameter associated with said electro-acoustical transducer and to provide a transducer signal based on the monitoring;
processing circuitry, which, in operation:
generates an error detection signal based on the transducer signal; and
generates the parametric signals based on the error detection signal, wherein said processing circuitry comprises:
at least one integration block configured to provide an integrated signal based on the transducer signal; and
an error filter configured to provide said error detection signal based on the integrated signal; and
a level meter, which, in operation, provides a level meter signal to said processing circuitry based on the output signal, wherein said processing circuitry includes:
a displacement block, which, in operation, provides an expected displacement signal based on the level meter signal; and
an adder, which, in operation, receives said expected displacement signal and said integrated signal, and provides a displacement error signal based on the expected displacement signal and the integrated signal, wherein said error filter is configured to provide said error detection signal based on the displacement error signal.

17. The system of claim 16, comprising:
a band pass selector configured to provide a control signal; and
a band-pass filter configured to provide a band pass signal based on the output signal and the control signal, wherein said level meter provides said level meter signal based on said band pass signal.

18. A system, comprising:
an electro-acoustical transducer;
a multiband equalizer responsive to an input signal and to frequency-band parametric signals, said equalizer configured to provide an output signal to drive the electro-acoustical transducer;
a transducer element configured to monitor at least one physical parameter associated with said electro-acoustical transducer and to provide a transducer signal based on the monitoring; and
processing circuitry, which, in operation:
generates an error detection signal based on the transducer signal; and
generates the parametric signals based on the error detection signal, wherein said processing circuitry comprises:
a compensation filter, which, in operation, provides a compensated error detection signal based on the error detection signal;
a morphing block, which, in operation, provides a compensation signal based on the compensated error detection signal, the morphing block including a linear morphing block, a plurality of filter memories and a step counter; and
a coefficient filter, which, in operation, provides said parametric signals based on the compensation signal.

19. The system of claim 18 wherein said transducer element comprises at least one of: an accelerometer; an acoustic pressure sensor; a temperature sensor; a diaphragm position sensor; and an impedance sensor.

20. A method, comprising:
generating parametric signals associated with respective frequencies of a multiband equalizer;
generating an output signal of a multiband equalizer based on one or more compensating filters in response to an input signal and the parametric signals;
driving an electro-acoustical transducer based on the output signal of the multiband equalizer;
monitoring at least one physical response of the electro-acoustical transducer to the output signal using a transducer element;
generating a transducer element signal based on the monitoring; and
generating an error detection signal based on the transducer element signal, wherein the parametric signals are generated based on the error detection signal and generating the error detection signal includes:
integrating the transducer element signal;
filtering the integrated transducer element signal; and
generating a level meter signal based on the output signal.

21. The method of claim 20, comprising using at least one look-up table to generate the parametric signals.

22. The method of claim 20, comprising:
selecting a first frequency band of the signal processor and generating a first parametric signal associated with the first frequency band; and
selecting a second frequency band of the signal processor and generating a second parametric signal associated with the second frequency band.

23. A method, comprising:
generating an output signal of a multiband equalizer based on one or more compensating filters in response to an input signal and a parametric signal associated with at least one frequency band of the multiband equalizer;
driving an electro-acoustical transducer based on the output signal of the multiband equalizer;
monitoring at least one physical response of the electro-acoustical transducer to the output signal using a transducer element;
generating a transducer element signal based on the monitoring;
generating an error detection signal based on the transducer element signal;
generating the parametric signal associated with the at least one frequency band based on the error detection signal;
selecting a frequency band of the multiband equalizer; and generating a parametric signal associated with the selected frequency band, wherein generating the parametric signal includes:

generating a compensated error detection signal based on the error detection signal;

generating a compensation signal based on the compensated error detection signal; and generating parameter coefficients based on the compensation signal.

24. The method of claim 23 further comprising selecting a second frequency band of the multiband equalizer and generating a second parametric signal associated with the second frequency band.

25. A non-transitory computer-readable medium whose contents configure a signal processor to perform a method, the method comprising:

generating parametric signals associated with respective frequencies of a multiband equalizer;

generating an output signal based on one or more compensating filters in response to an input signal and the parametric signals;

driving an electro-acoustical transducer based on the output signal;

monitoring at least one physical response of the electroacoustical transducer to the output signal;

generating a transducer element signal based on the monitoring; and generating an error detection signal based on the transducer element signal, wherein the parametric signals are generated based on the error detection signal and generating the error detection signal includes:

integrating the transducer element signal;

filtering the integrated transducer element signal; and generating a level meter signal based on the output signal.

26. The non-transitory computer-readable medium of claim 25 comprising at least one look-up table.

27. The non-transitory computer-readable medium of claim 25 wherein the method comprises:

selecting a first frequency band of the signal processor and generating a first parametric signal associated with the first frequency band; and selecting a second frequency band of the signal processor and generating a second parametric signal associated with the second frequency band.

* * * * *